(12) United States Patent
Manansala (10) Patent No.: US 6,653,723 B2
(45) Date of Patent: Nov. 25, 2003

(54) SYSTEM FOR PROVIDING AN OPEN-CAVITY LOW PROFILE ENCAPSULATED SEMICONDUCTOR PACKAGE

(75) Inventor: Michael Manansala, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/094,954

(22) Filed: Mar. 9, 2002

(65) Prior Publication Data

US 2003/0170933 A1 Sep. 11, 2003

(51) Int. Cl.$^7$ ................................................ H01L 23/02
(52) U.S. Cl. ...................... 257/680; 257/735; 382/124
(58) Field of Search ............................... 257/680, 735, 257/252, 254, 414, 415; 382/124

(56) References Cited

U.S. PATENT DOCUMENTS

| | | | | | |
|---|---|---|---|---|---|
| 4,649,418 A | * | 3/1987 | Uden | ........................ | 257/679 |
| 5,963,679 A | * | 10/1999 | Setlak | ........................ | 382/312 |
| 6,014,066 A | * | 1/2000 | Harberts et al. | ............ | 333/104 |
| 6,028,773 A | * | 2/2000 | Hundt | ........................ | 361/760 |
| 6,307,258 B1 | * | 10/2001 | Crane, Jr. et al. | ........... | 257/680 |
| 2002/0081780 A1 | * | 6/2002 | Salatino et al. | ............ | 438/127 |

* cited by examiner

Primary Examiner—T. N. Quach
(74) Attorney, Agent, or Firm—Sheppard, Mullin, Richter & Hampton LLP (57) ABSTRACT

System for providing an open-cavity semiconductor package. The system includes a method for wire bonding a finger sensor die to an external circuit. The finger sensor die includes a sensor array having one or more die contacts that are wire bonded to one or more external contacts of the external circuit so that a usable portion of the sensor array is maximized. The method comprises steps of forming a ball at a first end of a bonding wire, forming an electrically conductive connection between the ball and a selected external contact of the external circuit, extending the bonding wire to a selected die contact so as to form a wire loop having a low loop height, and forming an electrically conductive stitch connection between a second end of the bonding wire and the selected die contact.

11 Claims, 9 Drawing Sheets

SYSTEM FOR PROVIDING AN OPEN-CAVITY LOW PROFILE ENCAPSULATED SEMICONDUCTOR PACKAGE

FIELD OF THE INVENTION

The present invention relates to semiconductor devices, and more particularly, to a system for providing a fingerprint sensor with increased sensor accessibility.

BACKGROUND OF THE INVENTION

Semiconductor devices are increasingly being used as input devices for digital systems. For example, in identification and security applications, semiconductor devices are used to provide user identification information. One such device is a semiconductor fingerprint sensor.

Figure 1:
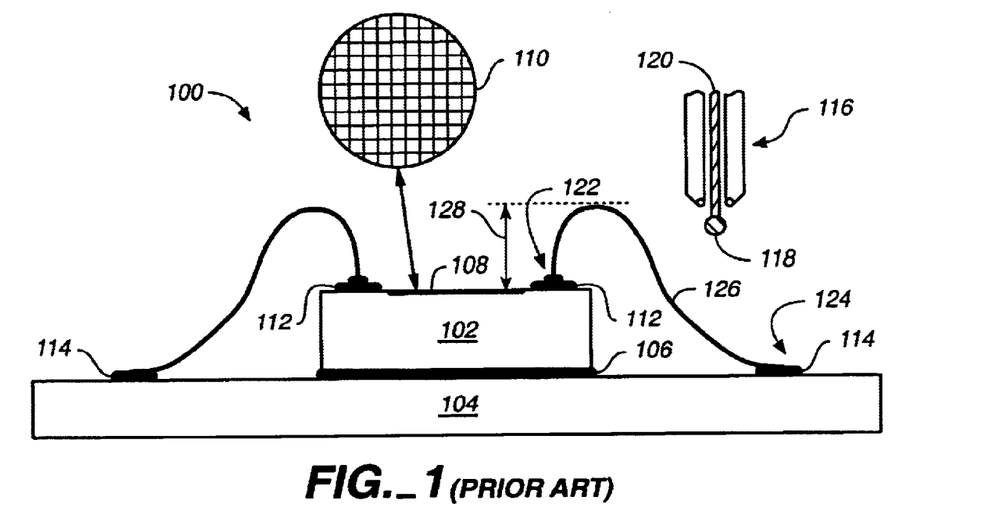
FIG. 1 shows typical electrical connections to a finger sensor die.

FIG. 1 shows a portion of a typical semiconductor fingerprint sensor 100. Generally, such a sensor is provided as an integrated circuit (IC). The sensor 100 includes a die (or wafer) 102 attached to a substrate 104 via an adhesive or epoxy bond 106. A sensor surface 108 of the die 102 has a conductive grid, shown in detail at 110, that is used to form a capacitive circuit to detect characteristics of a person's finger when the sensor surface is touched. The grid is coupled to a plurality of die contact members 112 at the surface of the die.

A technique known as wire bonding is used to couple the die contact members 112 to substrate contacts 114 located on the substrate material, which is normally made up of metallic lead frame or build up layers of substrate. Typically, wire bonding involves attaching small wires (gold or aluminum) between two contact members. A capillary device, shown at 116, is typically used to bond the wire between the contacts. When bonding the wire, the capillary device first forms a ball 118 at the end of a wire 120 by using an electronic flame-off (EFO) technique. Once the ball is formed, the capillary device attaches the ball 118 to a die contact pad 112 by a thermal-sonic process. In this process, the contact is heated and ultrasonic power is used to agitate the ball onto contact to flatten out the ball to form an inter-metallic weld between the ball and the contact, as shown at 122.

After the first weld is made, the capillary device 116 extends the wire 120 over to a substrate contact 114 to form a weld with that contact. To bond the wire to the substrate contact 114, a stitch weld is formed. The stitch weld bonds the wire to the substrate contact and cuts the wire at the same time, so that the capillary device may form a new ball on a next portion of the wire and proceed to the next die contact. For example, a stitch weld is shown at 124.

The wire 126 shows the result of the wire bonding process described above. Because the wire extends in generally a vertical direction from the weld of the ball to the die contact, a wire loop is formed when the wire is extended to the substrate contact. The wire loop has a height above the surface of the die is shown at 128. For standard wire bonding processes, this loop height is between six to ten thousandths (mils) of an inch high. As described in the following text, the loop height has an effect on the operation of finger sensor 100.

Once the wire bonding is completed and all bonding wires are installed, the device is protected by an encapsulation process in which a material, such as plastic, completely covers the bonded wires. For example, a molding process may be used where a material is molded around the device. Another process that may be used is referred to as "glob-top" dispensing, where material is dispensed onto the top of the device and allowed to flow around the sides and bottom of the device.

Figure 2:
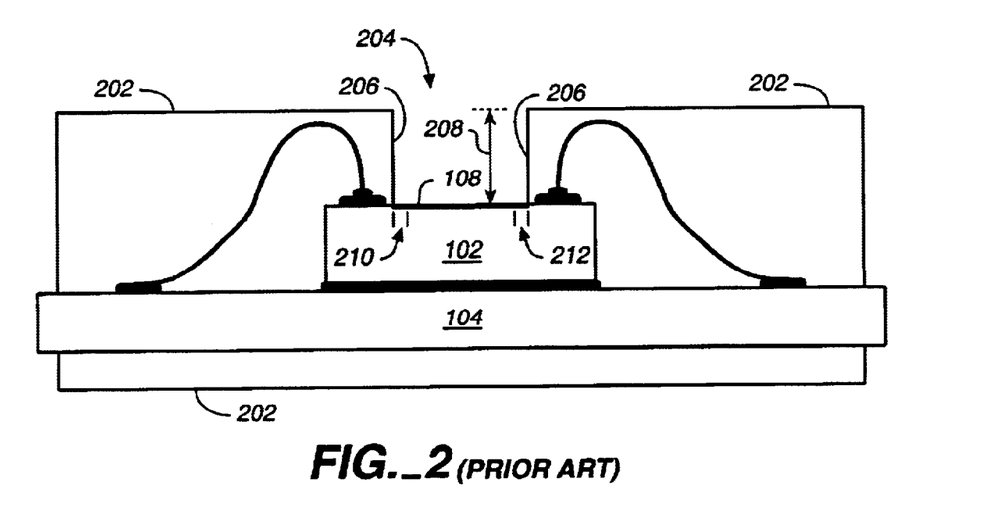
FIG. 2 shows a typical encapsulated use with a finger sensor die.

FIG. 2 shows the finger sensor 100 after an encapsulation process is completed so that the bonding wires are completely protected by an encapsulation material 202. However, for the finger sensor to operate, the sensor surface 108 is exposed by a cavity 204 in the encapsulation material to allow a person finger to come in contact with the sensor surface.

To cover the bonding wires and still provide access to the sensor surface 108, the cavity in the encapsulation material includes cavity walls 206 that are at least as high as the loop height of the bonding wires. The cavity walls form what is referred to as a pedestal that has a pedestal height, shown at 208. Unfortunately, as a result of the pedestal height, portions of the sensor surface 108 may not be reachable by a person's finger. For example, the sensor surface regions shown at 210 and 212 may be inaccessible to a person's finger because it is not possible squeeze the finger into the corner formed by the sensor surface and the cavity wall.

Finger sensors typically provide their best operation when a maximum number of grid points can be touched. However, due to the effects of the pedestal height, portions of the sensor grid are unreachable, and so, the performance of the sensor may be degraded. Another problem associated with convention fingerprint sensors is the package size. Typical fingerprint sensors have die contacts on either side of the sensor surface. This results in a very large package that may be unsuitable for use in portable applications.

One way to overcome the above problems is to provide a larger cavity to account for the unreachable portions of the sensor surface. However, due to the geometry of the die, it may not be possible to provide a larger cavity without exposing portions of the die. Furthermore, even if a larger cavity were possible, the overall height of the encapsulation is undesirable because typical applications for finger sensors include portable devices, such as cell phones, that require the smallest possible size. For example, one conventional fingerprint sensor has approximate dimensions of 22×12× 0.4 millimeters, which is a relative large package that is unsuitable for use in portable applications.

Therefore, what is needed is a way to provide maximum access to a finger sensor surface while providing the smallest possible size to allow the device to be used in a variety of portable applications.

SUMMARY OF THE INVENTION

The present invention includes a system for wire bonding a finger sensor die to an external circuit to provide maximum access to the finger sensor surface while providing the smallest possible size to allow the device to be used in a variety of portable applications. The system reduces the height of wire loops formed by bonding wires so that the pedestal height of the encapsulation is reduced. The reduced height of the pedestal provides greater access to the sensor surface. Thus, by providing greater access to the sensor surface, more sensor grid points are used to produce a sensor read-out, which results in more accurate sensor operation. The system is equally applicable to stationary finger sensors and sweep finger sensors. Furthermore, by reducing the encapsulation height, the overall device package is reduced in size. This results in cost savings, as well as, allowing the device to be integrated into a variety of small portable devices.

In one embodiment of the present invention, a method for wire bonding a finger sensor die to an external circuit is provided. The finger sensor die includes a sensor array having one or more die contacts that are wire bonded to one or more external contacts of the external circuit so that a usable portion of the sensor array is maximized. The method comprises steps of forming a ball at a first end of a bonding wire, forming an electrically conductive connection between the ball and a selected external contact of the external circuit, extending the bonding wire to a selected die contact so as to form a wire loop having a low loop height, forming an electrically conductive stitch connection between a second end of the bonding wire and the selected die contact, and repeating the above steps until the one or more die contacts are wire bonded to the one or more external contacts of the external circuit.

In another embodiment of the present invention, a portable fingerprint sensor device is provided. The device includes a finger sensor die that includes a sensor array having one or more die contacts that are wire bonded to one or more external contacts of an external circuit so that a usable portion of the sensor array is maximized. The device comprises bonding wires coupled between the die contacts and the external contacts, where the bonding wires form wire loops having very low loop heights above the sensor array surface. The device is encapsulated with an encapsulation material that forms a cavity around the sensor array to allow a person to touch the sensor array. As a result of the low height of the loop, the cavity forms a low height pedestal to allow a maximum amount of the sensor array to be accessible. In one or more variations, the cavity includes cavity walls that are stepped, sloped, and/or chamfered to provide even greater sensor surface access.

BRIEF DESCRIPTION OF THE DRAWINGS

The foregoing aspects and the attendant advantages of this invention will become more readily apparent by reference to the following detailed description when taken in conjunction with the accompanying drawings wherein.

DETAILED DESCRIPTION OF THE INVENTION

The present invention includes a system for bonding wires to a finger sensor die to provide maximum access to a finger sensor surface while providing the smallest possible size. The system reduces the height of wire loops formed by bonding wires so that the pedestal height of the encapsulation material is reduced. Thus, various embodiments of the system included in the present invention are discussed in detail in the following text.

Exemplary Embodiment

Figure 3:
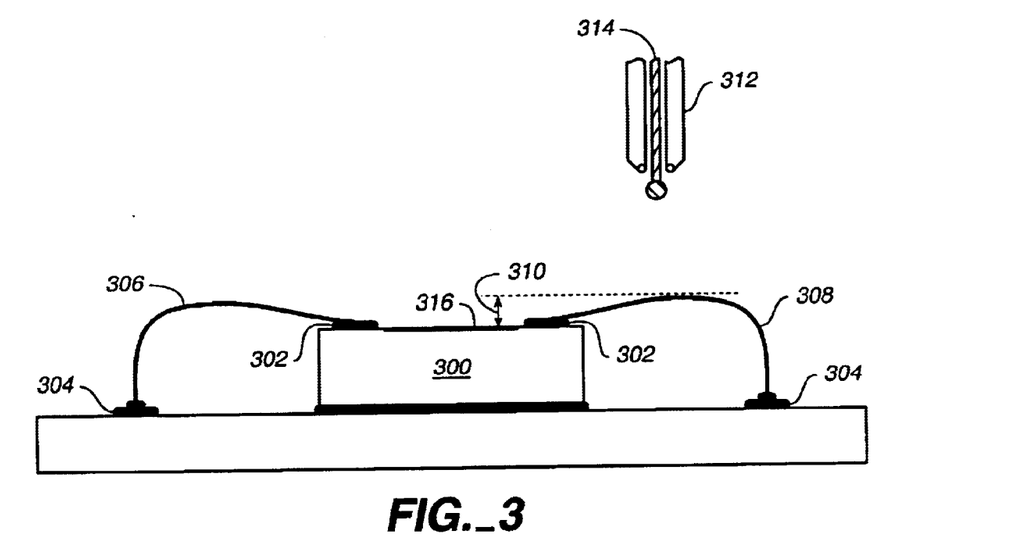
FIG. 3 shows one embodiment of a finger sensor die with wires bonded in accordance with the present invention.

FIG. 3 shows one embodiment of a finger sensor die 300 with wires bonded between die contacts 302 and substrate contacts 304 in accordance with the present invention. Bonding wires 306, 308 are shown having very low loop heights 310 in accordance with the present invention.

To form the wire bonds as shown in FIG. 3, the capillary device 312 forms a ball at the end of a bonding wire 314 and this ball is welded to one of the substrate contacts 304. The wire 314 is then extended to a die contact where a stitch weld is created to weld the bonding wire to the die contact. Thus, the welding process is reversed from conventional practices, however, the result is significant because the loop height 310 of the bonded wire is greatly reduced when compared to a conventionally bonded wire. This result is possible because a portion of the bonded wire that extends vertically from the ball weld is below the sensor surface 316, thereby allowing the wire to be extended to the die contact 302 while forming a loop having a very low loop height. Using this process, it is possible to achieve loop heights in the range of 1–2 mils, which is much less than the loop height created by conventional bonding techniques.

Figure 4:
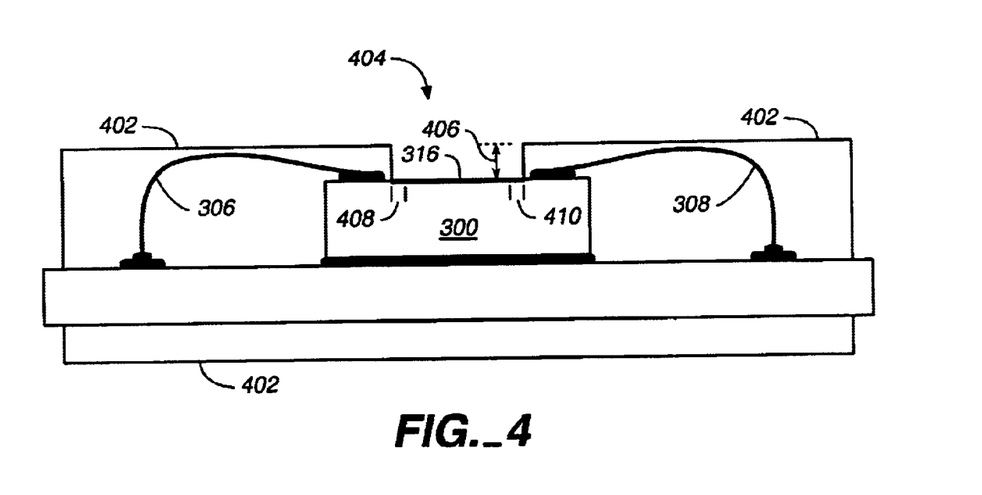
FIG. 4 shows the resulting encapsulation of the finger sensor die of FIG. 3.

FIG. 4 shows the resulting encapsulation of the finger sensor die 300 of FIG. 3. The encapsulation material 402 covers the bonded wires and provides a cavity 404 allowing the finger sensor to be accessed by a user. The cavity 404 is formed by a pedestal of encapsulation material having a pedestal height 406 that is very low as a result of the low loop height of the bonded wires. Thus, very small regions 408, 410 of the sensor 316 are inaccessible due to the low pedestal height.

Sensor Surface Recovery

One or more embodiments included in the present invention operate to increase access to portions of the sensor surface over conventional systems. For example, the amount of lost sensor surface, and corresponding sensor grid points, can be computed for a given sensor type, sensor density and pedestal height.

Figure 5A:
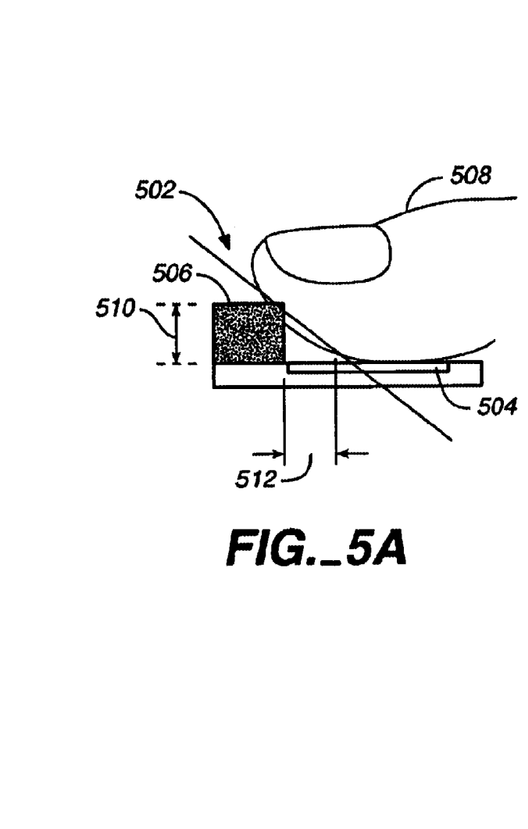
FIGS. 5a–5c illustrate how encapsulation height affects lost sensor area.
Figure 5B:
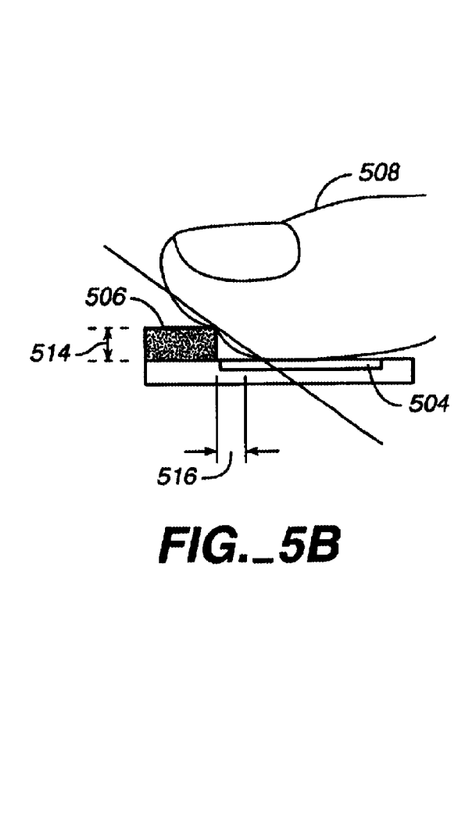
Figure 5C:
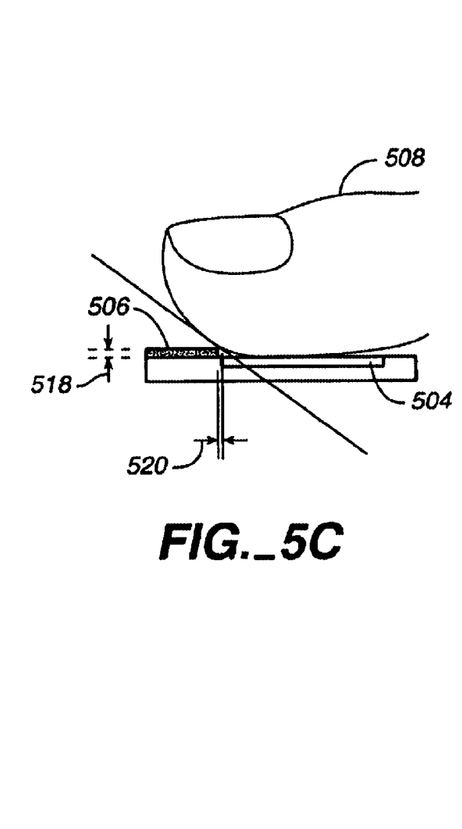

FIGS. 5a–c illustrate how encapsulation height affects lost sensor area of a sweep-type finger sensor. FIG. 5a shows a portion of a sweep sensor die 502 having a sensor surface 504 and encapsulation portion 506 that covers bonding wires attached to the die 502. A user's finger 508 is shown as it sweeps across the sensor surface 504. Because of the height 510 of the encapsulation portion 506, a portion of the sensor surface indicated at 512, is unable to be touched by the user's finger. Thus, this portion 512 does not contribute information about the user's finger at the output of the sensor, which results in a corresponding decrease in sensor performance.

FIGS. 5b and 5c show the sweep sensor die 502 with encapsulation portion 506 having varying heights and the corresponding effects on accessible sensor surface area. FIG. 5b shows the encapsulation portion 506 having height 514 that is less than the height 510. The resulting lost sensor surface 516 is less than the loss sensor surface indicated at 512. FIG. 5c shows the encapsulation portion 506 having height 518 that is less than the height 516. The resulting lost sensor surface 520 is less than the loss sensor surface indicated at 516. Thus, lower encapsulation pedestal heights result in more sensor surface area being accessible by a user. The lower encapsulation heights are achieved when bonding wires are attached in accordance with the invention.

Figure 6:
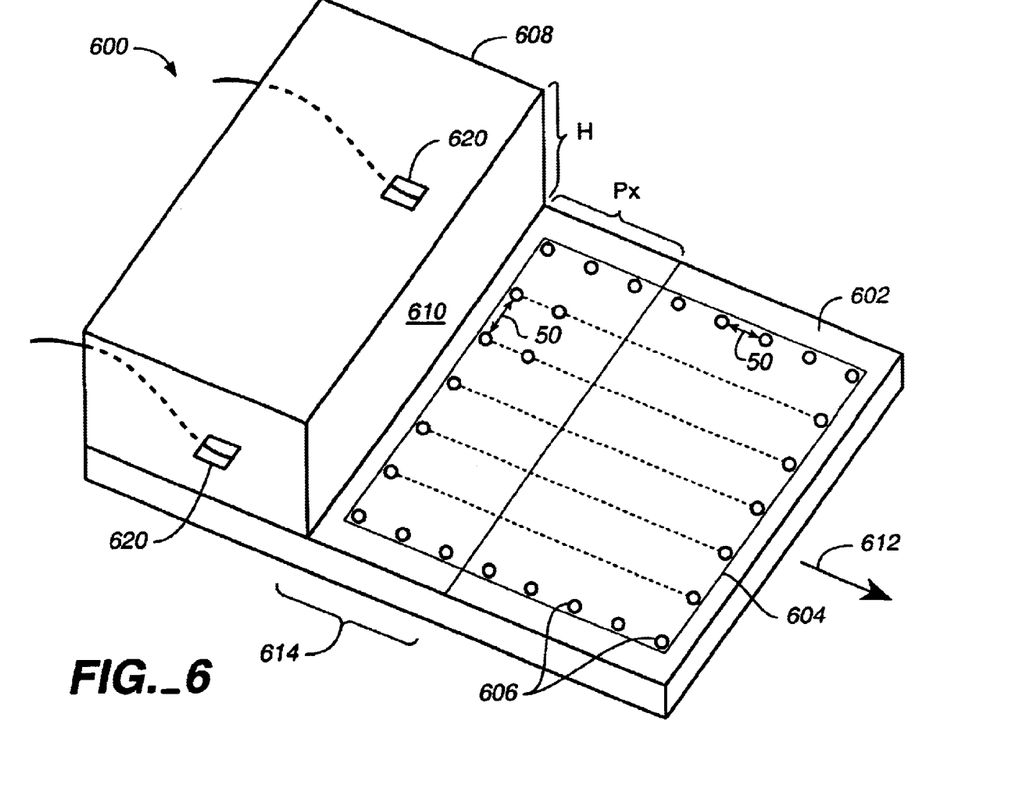
FIG. 6 shows a sweep finger sensor that illustrates lost sensor regions due to the height of the encapsulation pedestal.

FIG. 6 shows a portion of a sweep-type finger sensor 600 constructed in accordance with one embodiment of the present invention. The sweep-type fingerprint sensor obtains a reading when a user sweeps a finger across the sensor surface in a selected direction. The sweep-type finger sensor has its die contacts 620 moved from the ends of the sensor array to a position that is parallel to a side of sensor array, so that the die contacts line along a line that is perpendicular to the sweep direction. This arrangement results in a much smaller sensor device, however, it requires the encapsulation height to be very small or a significant portion of the sensor array will be inaccessible. Thus, wire bonding in accordance with the present invention is required to make such an arrangement practical.

The sensor 600 includes a die 602 that has a sensor surface 604. The sensor surface 604 includes grid points or sensor pixels 606 that form rows and columns of a sensor array. For this particular sensor, the distance between sensor pixels, referred to as the pitch size, will be assumed to be approximately 50 microns. The sensor 600 also includes a pedestal portion 608 formed during an encapsulation process that includes a cavity wall 610. The pedestal has a height (H) above the sensor surface 604, as shown.

During operation, a user sweeps a finger across the sensor surface 604 in a direction indicated by arrow 612. Because of the height (H) of the pedestal, a portion of the sensor surface within a certain distance ($P_x$) from the cavity wall 610 will not be touched by the user's finger. This untouched portion is indicated at 614, and pixels within this region will not contribute any information to the sensor read-out during the finger sweep.

For the sweep finger sensor 600, the lost sensor distance ($P_x$) due to the pedestal height (H) can be expressed as:

$$P_x = H \times SwLF$$

where SwLF is a sweep loss factor associated with a sweep finger sensor, and has a value of approximately 3.2. Thus, for a sweep sensor with conventional wire bonding and having a pedestal height of 300 um (approximately 11.8 mils), the lost sensor distance is approximately 960 um. With a sensor pitch of 50 microns, this lost sensor distance corresponds to a loss of approximately 19 rows of sensor pixels. However, in a sweep sensor with wires bonded in accordance with the present invention, a pedestal height of 38 um (approximately 1.5 mils) can be achieved, which results in a lost sensor distance ($P_x$) of 121 um. Thus, with a 50-micron sensor pitch, approximately 3 rows of sensor pixels will be lost. Thus, shown how wire bonding in accordance with the invention facilitates the die contact arrangement that is perpendicular to the sweep direction.

Figure 7:
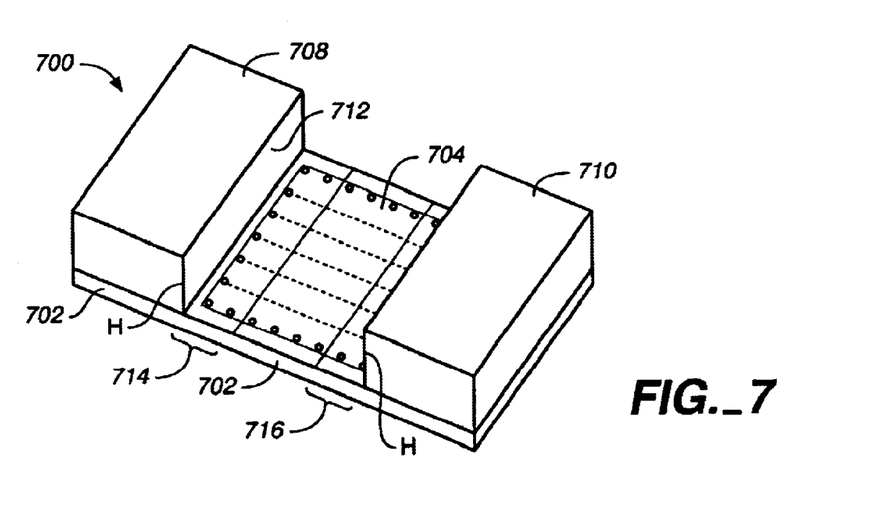
FIG. 7; shows a stationary finger sensor that illustrates lost sensor regions due to the height of the encapsulation pedestal.

FIG. 7 shows a portion of a stationary-type finger sensor 700. The sensor 700 includes a die 702 that has a sensor surface 704. The sensor surface 704 includes grid points or sensor pixels that form rows and columns of a sensor array. For this particular sensor, the pitch size will be assumed to be approximately 50 microns. The sensor 700 also includes pedestal portions 708 and 710 that are formed during an encapsulation process. The pedestal portion 708 includes a cavity wall 712, and the portion 710 includes a cavity wall not visible in FIG. 7. Both pedestal portions have a height (H) above the sensor surface 704, as shown.

During operation, a user places a finger on the sensor surface 704. Because of the height (H) of the pedestal portions, two portions of the sensor surface 704 within a certain distance from the pedestal walls will not be touched by the user's finger. These portions have distances indicated at 714 and 716. Sensor pixels within these regions will not contribute any information to the sensor read-out.

For the stationary sensor 700, having two pedestals, the lost sensor distance $P_x$ can be expressed as:

$$P_x = 2 \times (H \times SLF)$$

where SLF is a loss factor for a stationary sensor, and has a value of approximately 1.8. Thus, for a stationary-type sensor having a pedestal height of 300 um (approximately 11.8 mils), the lost sensor distance is approximately 1080 um. With a sensor pitch of 50 microns, this lost sensor distance corresponds to a loss of approximately 22 rows of sensor pixels. However, in a finger sensor with wires bonded in accordance with the present invention, a pedestal height of 38 um (approximately 1.5 mils) can be achieved, and results in a lost sensor distance ($P_x$) of approximately 137 um. Thus, with a 50-micron sensor pitch, approximately 3 rows of sensor pixels will be lost.

Therefore, finger sensors having wires bonded in accordance with the present invention result in low wire loop heights that translate to lower encapsulation pedestals. The lower pedestals allow more of the sensor surface to be accessible to a user's touch, and so, sensors having wires bonded in this fashion are able to utilize more of the sensor array to produce more accurate read-outs than conventionally bonded finger sensors. By providing access to more of the sensor surface, wire bonding in accordance with the present invention allows the use of smaller finger sensors in application that require small sensors, such as in portable cell phone applications and other mobile portable devices.

Cost Savings

As described above, reducing the encapsulation height results in more usable sensor area. Thus, by reducing the amount of lost sensor area, smaller sensors having less material can be produced. For example, less sensor and encapsulation material is required. Given the potential for high volumes of manufactured fingerprint sensors, a huge cost savings can be realized.

Additional Embodiments

The following is a description of alternative embodiments included in the present invention to further reduce pedestal height, and thereby, result in even smaller finger sensors.

Figure 8:
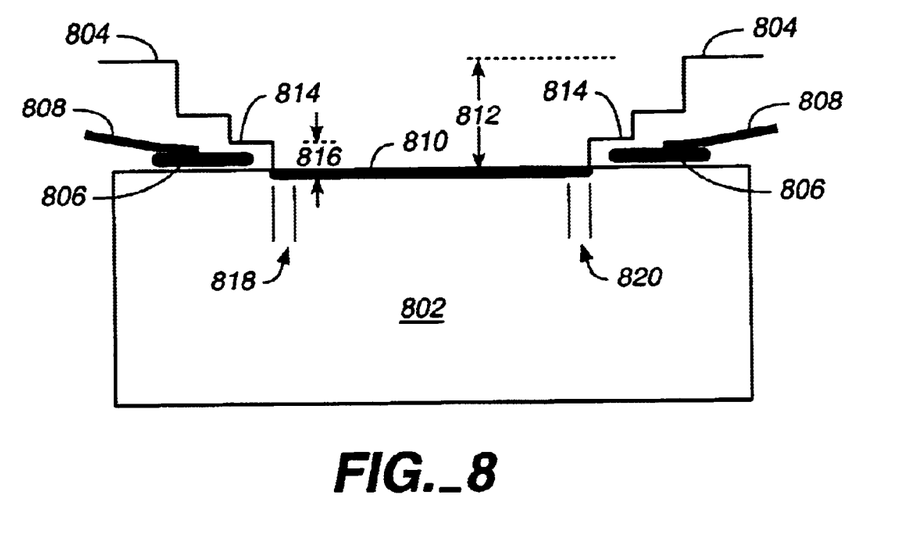
FIG. 8 shows a stepped encapsulation constructed in accordance with the present invention.

FIG. 8 shows a stationary-type finger sensor die 802 with stepped encapsulation portions 804 constructed in accordance with the present invention. The die 802 includes bonding wires 808 that are stitch welded to die contacts 806 in accordance with the present invention. Thus, the bonding wires form wire loops (not shown) having low loop heights as described above.

The sensor die 802 includes a sensor surface 810 that is used to sense characteristics of a user's fingerprint, such as small ridges and valleys that are referred to as the minutiae. The stepped encapsulation 804 covers the wire loops formed by the bonding wires so that a maximum encapsulation height 812 above the sensor surface 810 can be defined. As described above, this maximum encapsulation height is greatly reduced compared to conventional sensors as a result of the wire bonding techniques included in the present invention. However, as will be described, the stepped encapsulation makes it possible to effectively reduce the encapsulation height even more to provide greater access to the sensor surface 810.

The stepped encapsulation 804 forms a stair step structure that generally follows the profile of the bonding wires 808 as they extend to the die contacts 806. A last step structure 814 occurs closest to the sensor surface so that a step height, as indicated at 816, above the sensor surface 810 is minimized. The effect of the small step height is to provide the greatest access to the sensor surface. For example, as a result of the small step height, regions of the sensor surface that are inaccessible, shown at 818 and 820, are minimized. Therefore, using the stepped encapsulation 804 it is possible to further reduce pedestal height to increase a user's access to the sensor surface.

Figure 9:
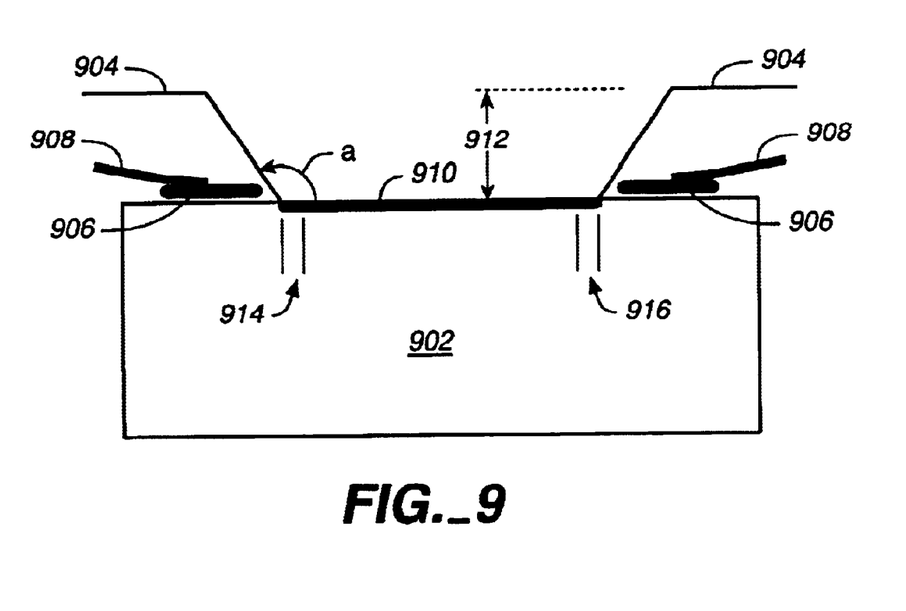
FIG. 9 shows a sloped encapsulation constructed in accordance with the present invention.

FIG. 9 shows a stationary-type finger sensor die 902 with a sloped encapsulation portion 904 constructed in accordance with the present invention. The die 902 includes bonding wires 908 that are stitch welded to die contacts 906 in accordance with the present invention. Thus, the bonding wires form wire loops (not shown) having low loop heights as described above.

The sensor die 902 includes a sensor surface 910 that is used to sense characteristics of a user's finger. The slopped encapsulation 904 covers the wire loops formed by the bonding wires so that a maximum encapsulation height 912 above the sensor surface 910 can be defined. As described above, this maximum encapsulation height is greatly reduced compared to conventional sensors as a result of the wire bonding techniques included in the present invention. However, as will be described, the stepped encapsulation makes it possible to effectively reduce the encapsulation height even more to provide greater access to the sensor surface 910.

The sloped encapsulation portion 904 is sloped to cover the bonding wires yet provide the lowest encapsulation height possible to allow the greatest access to the sensor surface. As a result, inaccessible regions of the sensor surface 914, 916 are minimized. To achieve this result, a slope angle (a) is selected so that encapsulation portion 904 covers the bonding wires and die contacts, yet allows the encapsulation to form the largest cavity possible around the die surface 910. Any desired slope angle may be selected that allows the encapsulation to provided the desired protection.

The stepped and sloped encapsulation techniques described herein are equally applicable to stationary-type and sweep-type finger sensors. Therefore, by providing wire bonding in accordance with the present invention, combined with either of the above described encapsulation techniques, a finger sensor can be achieved having limited regions that are inaccessible while comprising a very small overall package that can readily be used in a variety of portable applications.

Figure 10:
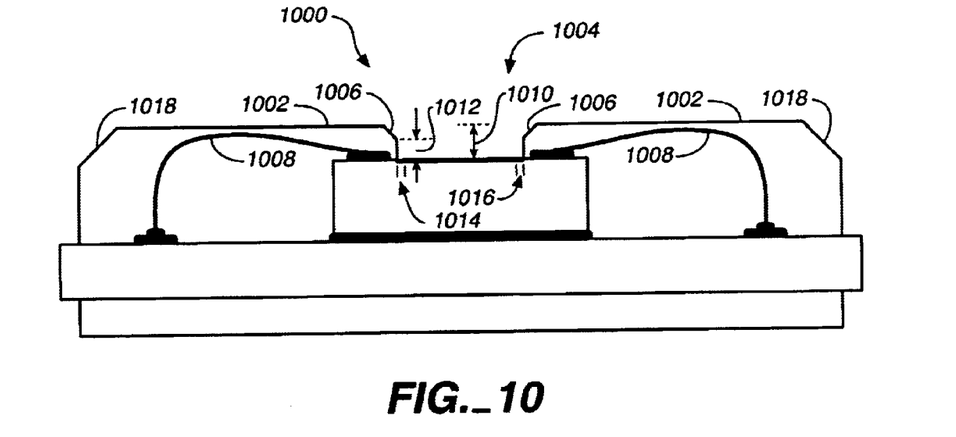
FIG. 10 shows a fingerprint sensor with chamfered encapsulation portions constructed in accordance with the present invention.

FIG. 10 shows a fingerprint sensor 1000 with chamfered encapsulation portions constructed in accordance with the present invention. For example, the fingerprint sensor 1000 includes encapsulation material 1002 that forms a cavity 1004. At the edge of the cavity walls, the encapsulation material is chamfered as show at 1006.

The fingerprint sensor 1000 includes bonding wires 1008 that are bonded in accordance with the present invention to have a low loop height to result in a low encapsulation pedestal. This encapsulation pedestal has a height shown by 1010. However, the chamfer regions 1006 operate to further reduce the pedestal height so that the effective pedestal height is shown at 1012. This reduced pedestal height results in small inaccessible sensor array regions 1014, 1016 that are smaller as a result of the chamfer 1006 than they would be without the chamfer.

Additional chamfer regions 1018 are provided to further reduce the overall size of the fingerprint sensor package. Thus, the chamfer regions operate in conjunction with the low height bonding wires to increase the amount of usable sensor array and reduce the overall package size of the device.

Figure 11:
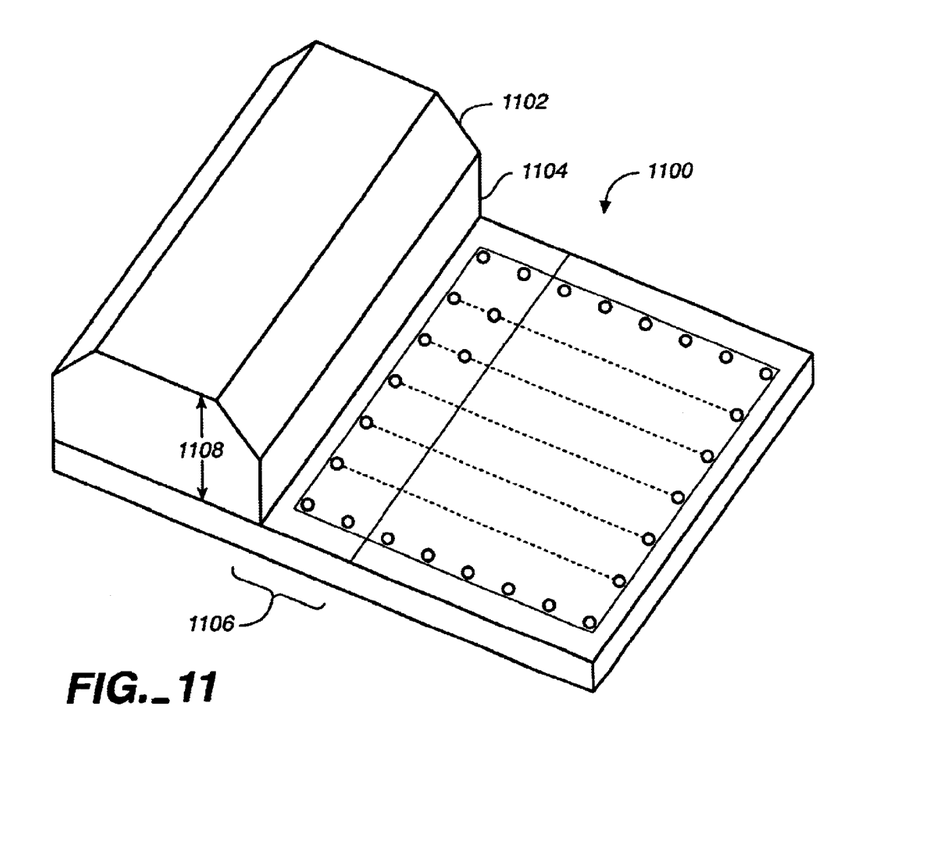
FIG. 11 shows a sweep-type fingerprint sensor with a chamfered encapsulation constructed in accordance with the present invention.

FIG. 11 shows a sweep-type fingerprint sensor 1100 with a chamfered encapsulation constructed in accordance with the present invention. The chamfer portion 1102 results in an effective pedestal height shown 1104, which translates into an inaccessible sensor region as defined by 1106. This region is determined from the above-described embodiments, however, the chamfer portion 1102 operates to produce a smaller inaccessible region than if the chamfer 1102 was not used. For example, without chamfer 1102 the pedestal height shown at 1108 would be used to determine the inaccessible region of the sensor surface, which would be large than the region defined by 1106. Thus, the chamfer operates to increase usable sensor area.

FIGS. 12*a*–*d* show top, bottom, side, and isometric views of an exemplary fingerprint sensor 1200 constructed in accordance with the present invention. The fingerprint sensor 1200 is representative of a fine pitch ball grid array (FBGA) sensor.

Figure 12A:
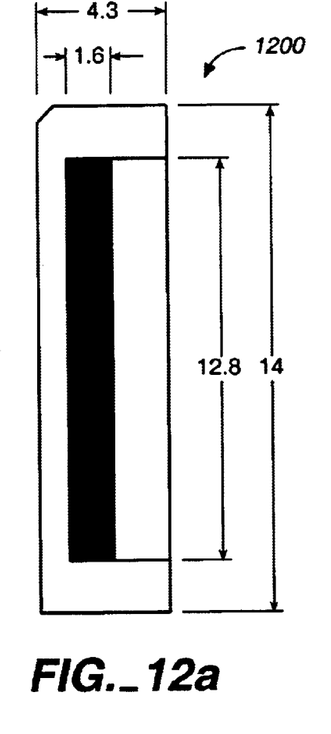
FIGS. 12a–12d show top, bottom, side, and isometric views of an exemplary fingerprint sensor constructed in accordance with the present invention.

FIG. 12*a* shows a top view of the sensor 1200 and provides dimensions in millimeters (mm). Because the fingerprint sensor 1200 utilizes wire bonding in accordance with the present invention, the overall size of the sensor is greatly reduced as compared to conventional sensors. For example, the width of the sensor 1200 is approximately 4.3 mm as compared to a conventional fingerprint sensor that has a width of approximately 12–13 mm, and therefore would be four times wider.

Figure 12B:
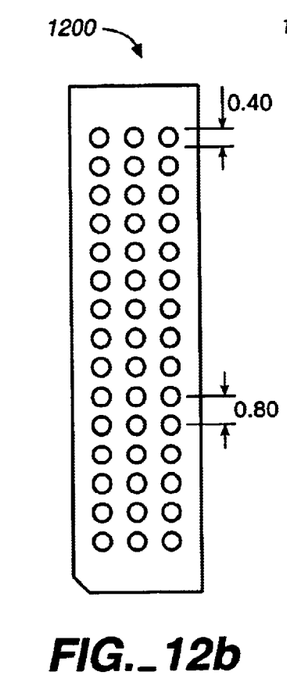
Figure 12C:
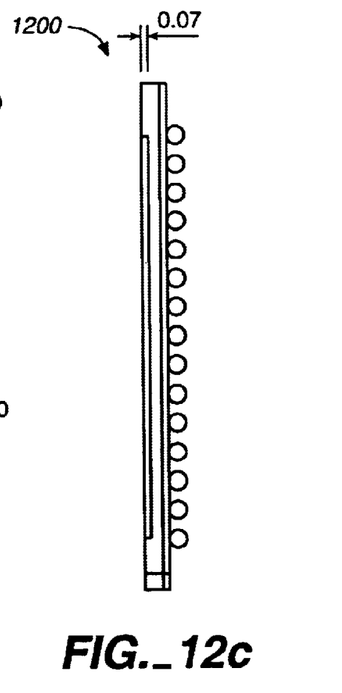
Figure 12D:
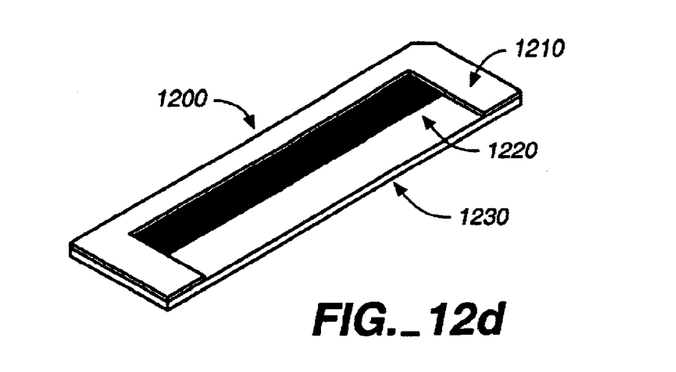

FIG. 12*b* shows a bottom view of the fingerprint sensor 1200 and illustrates a ball grid array that is used to electrically interface to the sensor. FIG. 12*c* shows a side view of the sensor 1200 and illustrates how providing wire bonding in accordance with the present invention results in a low encapsulation pedestal height. For example, an encapsulation height of 0.07 mm is achieved by the sensor 1200, which is far less than conventional sensors that have encapsulation heights of approximately 0.4 mm. Lastly, FIG. 12*d* shows an isometric view of the sensor 1200.

Figure 13:
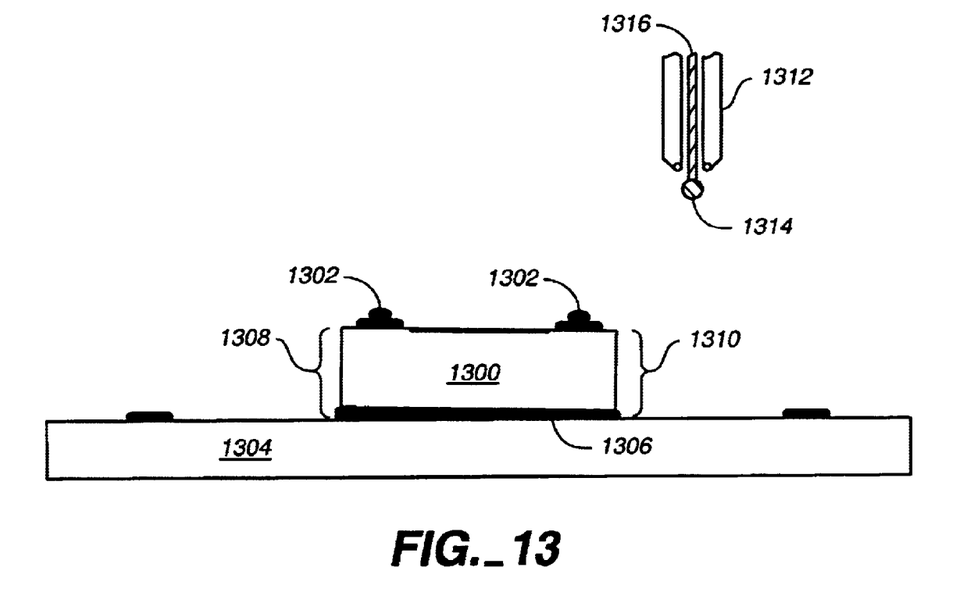
FIG. 13 shows one embodiment of a fingerprint sensor die with ball compensators placed on the die contacts to compensate for die misalignments.

FIG. 13 shows one embodiment of a fingerprint sensor die 1300 with ball compensators 1302 placed on the die contacts to compensate for die misalignments. For example, as shown in FIG. 13, the die 1300 is misaligned on the substrate 1304 due to variations at the epoxy boundary 1306. As a result, the height of the die above the substrate is uneven. For example, the height shown at 1308 is greater than the height shown at 1310.

To compensate for the die height differences, compensator balls 1302 are placed on each die contact prior to the wire bonding process. For example, the capillary device 1312 forms a ball 1314 at the end of a wire 1316 and deposits the ball at a selected die contact. This process is repeated for each die contact. The compensator balls 1302 are then used during the wire bonding process to compensate for the die height variations.

Figure 14:
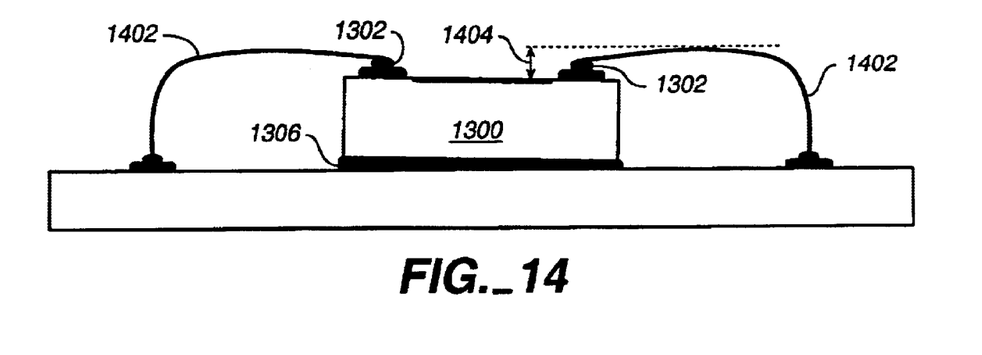
FIG. 14 shows the fingerprint sensor die of FIG. 13 with bonding wires attached in accordance with the present invention.

FIG. 14 shows the fingerprint sensor die 1300 of FIG. 13 with bonding wires 1402 attached in accordance with the present invention. The bonding wires are coupled to the die 1300 via the compensators balls 1302. The compensator balls 1302 allow some variation in the coupling of the bonding wires to the die contacts. As a result, the variation of the die height due to the epoxy boundary 1306 is compensated for, and the bonding wires 1402 form wire loops having very low loop heights 1404 in accordance with the present invention. Thus, the compensator balls 1302 operate to compensate for die misalignments while still providing for wire bonding in accordance with the present invention.

Figure 15:
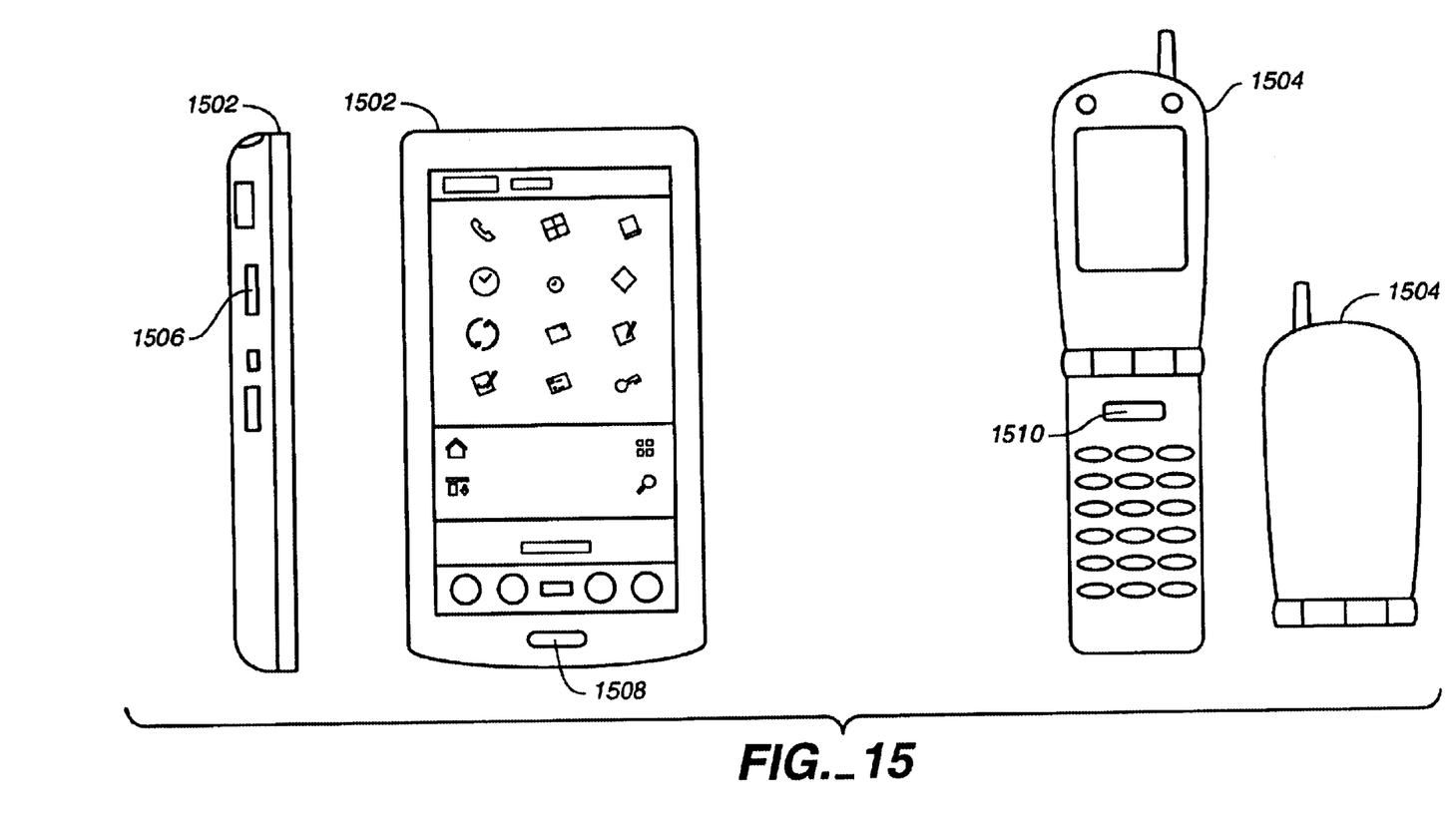
FIG. 15 shows a PDA and a portable mobile telephone with fingerprint sensors constructed in accordance with the present invention.

FIG. 15 shows a personal digital assistant (PDA) 1502 and a portable mobile telephone 1504 with integrated fingerprint sensors constructed in accordance with the present invention. Because of the small size of the fingerprint sensors, their incorporation into a variety of small portable devices is possible, whereas, the incorporation of larger conventional sensors would not be possible.

In one embodiment, a fingerprint sensor in incorporated into a side portion of the PDA 1502 as shown at 1506. In another embodiment, a fingerprint sensor is incorporated into a front portion of the PDA 1502, as shown at 1508. In still another embodiment, a finger sensor is incorporated into keypad portion of the telephone 1504, as shown at 1510. Thus, because of the small package size achieved by wire bonding in accordance with the present invention, it is possible to incorporate a fingerprint sensor into a variety of small portable devices.

The present invention includes a system for wire bonding a finger sensor die to an external circuit to provide maximum access to the finger sensor surface while providing the smallest possible size to allow the device to be used in a variety of portable applications. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A fingerprint sensor device that includes a finger sensor die coupled to an external circuit, wherein the finger sensor die includes a sensor array having one or more die contacts and the external circuit includes one or more external contacts, the finger sensor device comprising:

one or more bonding wires coupled between the die contacts and the external contacts, wherein the bonding wires form wire loops having low loop heights that extend above a top surface of the sensor die by an amount substantially in the range of 1 to 2 mils; and an encapsulation material that covers the bonding wires and forms a cavity around at least a portion of the sensor array that minimizes an inaccessible portion of the sensor array.

2. The fingerprint sensor of claim 1, wherein the fingerprint sensor is a sweep-type fingerprint sensor and the cavity has a cavity wall having a height (H) above the sensor array and wherein the inaccessible portion of the sensor array is substantially equivalent to a region defined by (3.2×H).

3. The fingerprint sensor of claim 2, wherein the encapsulating material forms the cavity wall to be perpendicular to the sensor array.

4. The fingerprint sensor of claim 2, wherein the encapsulating material forms the cavity wall to be sloped.

5. The fingerprint sensor of claim 2, wherein the encapsulating material forms the cavity wall to be stepped.

6. The fingerprint sensor of claim 2, wherein the encapsulating material forms the cavity wall to be chamfered.

7. The fingerprint sensor of claim 2, wherein the value of H is substantially in the range of 1 to 2 mils.

8. The fingerprint sensor of claim 1, wherein the fingerprint sensor is a stationary-type fingerprint sensor and the cavity has a cavity wall having a height (H) above the sensor array and wherein the inaccessible portion of the sensor array is substantially equivalent to a region defined by (1.8×H).

9. A fingerprint sensor device, comprising:

a finger sensor die having die contacts on a surface of the finger sensor die;

an external circuit having external contacts on a surface of the external circuit, the surface of the external circuit is located to a position lower than the surface of the finger sensor die; and one or more bonding wires coupled between the die contacts and the external contacts;

wherein one end of the bonding wires are connected to selected external contacts of the external circuit through a ball made at the one end of the bonding wires, and the other end of the bonding wires are connected to selected die contacts.

10. The fingerprint sensor device of claim 9, wherein the other end of the bonding wires are connected to the selected die contacts through a ball located on the respective selected die contacts.

11. A fingerprint sensor device, comprising:

a finger sensor die having die contacts on a surface of the finger sensor die;

an external circuit having external contacts on a surface of the external circuit, the surface of the external circuit is located to a position lower than the surface of the finger sensor die; and one or more bonding wires coupled between the die contacts and the external contacts;

wherein the bonding wires extend in a direction vertical to the surface of the external circuit from selected external contacts of the external circuit, and then loop from the vertically extended bonding wires toward selected die contacts of the finger sensor die.

* * * * *